(12) United States Patent
Preuschl et al.

(10) Patent No.: US 10,440,845 B2
(45) Date of Patent: Oct. 8, 2019

(54) ELECTRONIC TRANSMISSION CONTROLLER, AND METHOD FOR PRODUCING SAME

(71) Applicant: ZF Friedrichshafen AG, Friedrichshafen (DE)

(72) Inventors: Thomas Preuschl, Sinzing (DE); Josef Loibl, Bad Abbach (DE)

(73) Assignee: ZF Friedrichshafen AG, Friedrichshafen (DE)

(*) Notice: Subject to any disclaimer, the term of this patent is extended or adjusted under 35 U.S.C. 154(b) by 26 days.

(21) Appl. No.: 15/327,286

(22) PCT Filed: Jun. 19, 2015

(86) PCT No.: PCT/EP2015/063786
§ 371 (c)(1),
(2) Date: Jan. 18, 2017

(87) PCT Pub. No.: WO2016/008672
PCT Pub. Date: Jan. 21, 2016

(65) Prior Publication Data
US 2017/0171996 A1    Jun. 15, 2017

(30) Foreign Application Priority Data

Jul. 18, 2014   (DE) .................. 10 2014 214 057

(51) Int. Cl.
*H05K 5/00* (2006.01)
*H05K 1/11* (2006.01)
(Continued)

(52) U.S. Cl.
CPC ............ *H05K 5/0082* (2013.01); *H05K 1/11* (2013.01); *H05K 3/06* (2013.01); *H05K 3/282* (2013.01);
(Continued)

(58) Field of Classification Search
CPC ...... H05K 5/0082; H05K 5/0017; H05K 3/06; H05K 3/4644; H05K 1/11; H05K 3/281;
(Continued)

(56) References Cited

U.S. PATENT DOCUMENTS 6,608,757 B1 * 8/2003 Bhatt ................ H05K 3/445
174/250
8,488,324 B2 * 7/2013 Becker .............. H05K 5/0082
165/80.2
(Continued)

FOREIGN PATENT DOCUMENTS

DE    10 2007 029 913 A1    1/2009
EP         1 672 972 A1    6/2008

OTHER PUBLICATIONS

International Search Report and Written Opinion of the International Search Authority dated Sep. 7, 2015 in International Application No. PCT/EP2015/063786 (English and German languages) (11 pp.).

*Primary Examiner* — Xanthia C Cunningham
(74) *Attorney, Agent, or Firm* — Brinks Gilson & Lione

(57) ABSTRACT

The present disclosure relates to an electronic transmission controller, with a housing, a printed circuit board assembly, and at least one electronic module mounted on the printed circuit board assembly. The printed circuit board assembly may include a first region extending inside the housing, the first region being sealed from an external fluid. The printed circuit board assembly may include a second region extending outside the housing. The printed circuit board assembly may include a plurality of electrically conductive conductor path layers which are electrically insulated against one another by dielectric layers. An outer layer made of a fluid resistant and electrically insulating material may be applied to at least one outer electrically conductive conductor path
(Continued)

layer of the plurality of conductive path layers at a location of the second region of the printed circuit board assembly.

13 Claims, 1 Drawing Sheet

(51) Int. Cl.
*H05K 3/28* (2006.01)
*H05K 3/06* (2006.01)
*H05K 3/46* (2006.01)
*H05K 1/18* (2006.01)

(52) U.S. Cl.
CPC ......... *H05K 3/4644* (2013.01); *H05K 5/0017* (2013.01); *H05K 1/181* (2013.01); *H05K 1/185* (2013.01); *H05K 2201/0154* (2013.01); *H05K 2203/0759* (2013.01)

(58) Field of Classification Search
CPC ........ H05K 3/282; H05K 1/181; H05K 1/185; H05K 2201/10371; H05K 2201/0154; H05K 2203/0759
See application file for complete search history.

(56) References Cited

U.S. PATENT DOCUMENTS

| | | | |
|---|---|---|---|
| 2002/0061676 A1* | 5/2002 | Kameyama | H01R 4/2429 439/404 |
| 2006/0191715 A1* | 8/2006 | Koyama | H05K 3/20 174/264 |
| 2006/0225918 A1* | 10/2006 | Chinda | H01L 21/486 174/260 |

* cited by examiner

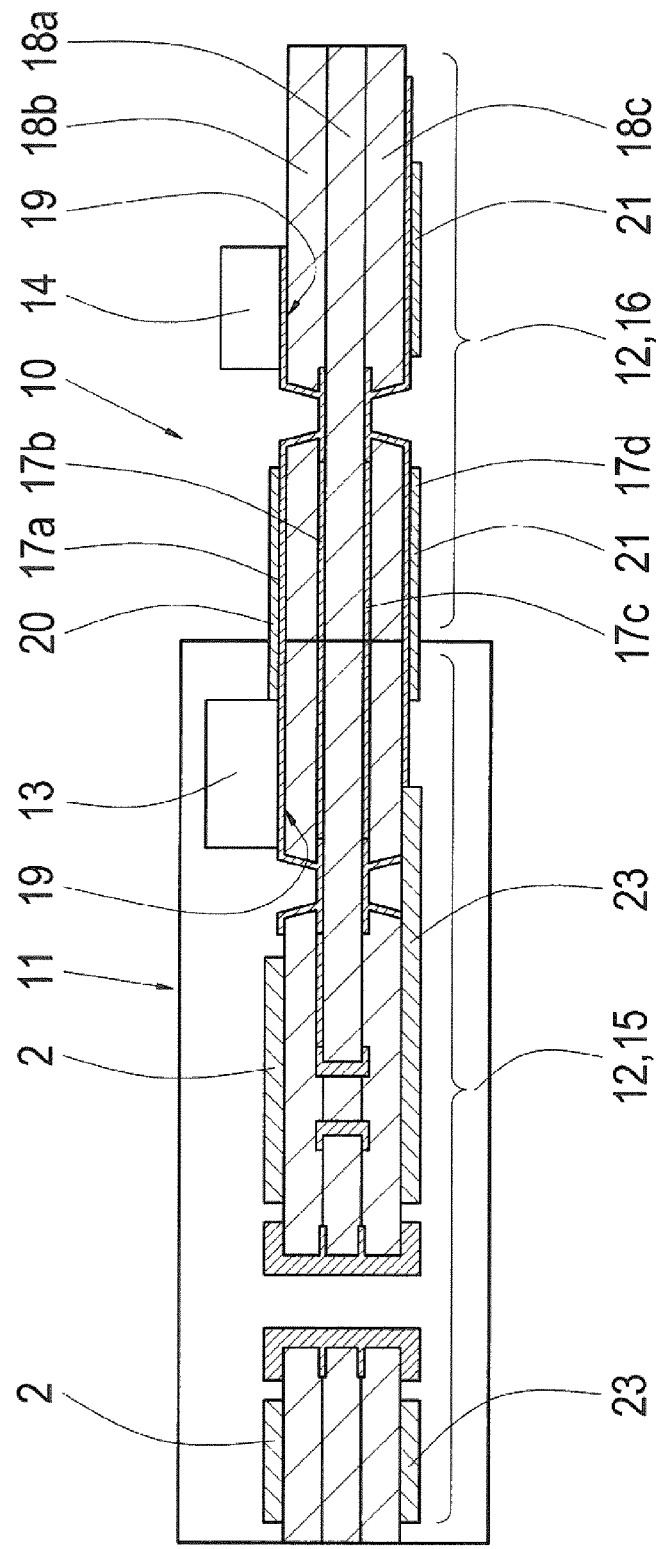

ELECTRONIC TRANSMISSION CONTROLLER, AND METHOD FOR PRODUCING SAME

CROSS REFERENCE TO RELATED APPLICATIONS

This application is a filing under 35 U.S.C. § 371 of International Patent Application PCT/EP2015/063786, filed Jun. 19, 2015, and claims the priority of German Patent Application 10 2014 214 057.9, filed Jul. 18, 2014. These applications are incorporated by reference herein in their entireties.

The present disclosure relates to an electronic transmission control device. Furthermore, the present disclosure relates to a method for the production of an electronic transmission control device.

BACKGROUND

It is known in the field that electronic transmission control devices have a housing, a printed circuit board assembly, and electric or electronic modules mounted on the printed circuit board assembly. The printed circuit board assembly of electronic transmission control devices is positioned partially inside the housing in a region sealed against oil, and partially outside the housing, in a region not sealed against oil. The printed circuit board assembly has numerous conductive conductor path layers, which are electrically insulated against one another by dielectric layers. A further dielectric layer is laminated onto the outer, electrically conductive conductor path layers in printed circuit board assemblies of electronic transmission control devices known in the field, onto which an electrically conductive contact layer, which is then largely removed through etching and remains only in the region of electric interfaces, which serve to form contacts between electric or electronic modules and the conductor path layers of the printed circuit board assembly. Regions of the contact layers applied to the outer dielectric layers not removed through etching in the proximity of electric interfaces are provided with a plating containing nickel and gold, in order to protect the same from corrosion caused by oil. This results in a relatively complex construction of the printed circuit board assemblies of electronic transmission devices known in the field.

Based on this, a fundamental objective of the present embodiments is to create a novel electronic transmission control device and a method for the production thereof.

SUMMARY

This objective is achieved through an electronic transmission control device.

According to the present disclosure, a final, conclusive, outermost layer made of an oil resistant electrically insulating substance is applied to the outer electrically conductive conductor path layers, at least in that section of the printed circuit board assembly extending outside of the housing, in the region not sealed against oil, aside from on interfaces, which serve as the electrical contact between the electric or electronic modules and the printed circuit board assembly.

The printed circuit board assembly of the electronic transmission control device according to the present disclosure has a simpler, more compact construction. A final, conclusive layer made of an electrically insulating substance is applied to the outer electrically conductive conductor paths layers. However, no electrically conductive contact layer is applied to these final layers. As a result, the number of electrically conductive layers is reduced by two in relation to the prior art. As a result, the lamination and etching procedures for the electrically conductive contact layers required according to the prior art that have been eliminated are also eliminated. By this means, it is possible to manufacture electronic transmission control devices in a simpler and more cost-efficient manner.

The printed circuit board assembly preferably has four electrically conductive conductor path layers, which are electrically insulated against one another by three dielectric layers, wherein a final, conclusive, outermost layer made of the oil resistant, electrically insulating substance, is applied to the outer, electrically conductive conductor path layers, aside from on the interfaces, at least in that section of the printed circuit board extending outside the housing. An electronic transmission control assembly of this type has a printed circuit board assembly having a particularly compact and simple construction.

According to a first, advantageous further development of the present disclosure, the respective, final, conclusive, outermost layer made of the oil resistant, electrically insulating substance, is designed as a lamination layer made of polyimide film or a prepreg. This further development of the present disclosure is particularly suitable when the housing of the electronic transmission control device is produced as a multi-shell aluminum die cast housing.

According to a second, alternative, advantageous further development of the present disclosure, the respective final, conclusive, outermost layer made of the oil resistant, electrically insulating substance is formed as an injection molded layer made of a plastic. This further development of the present disclosure is suitable in particular when the housing of the electronic transmission control device designed as a plastic injection molded housing.

A method according to the present disclosure for the production of an electronic transmission control device is defined in a method claim.

BRIEF DESCRIPTION OF THE DRAWING

Preferred further developments can be derived from the dependent claims and the following description. Exemplary embodiments of the present disclosure shall be explained in greater detail based on the drawing, without being limited thereto. Therein:

FIG. 1 shows a schematic cross section through an electronic transmission control device according to the present disclosure.

DETAILED DESCRIPTION

The present disclosure relates to an electronic transmission control device of the type used, e.g., in automatic transmissions of motor vehicles.

FIG. 1 shows a strongly schematized depiction of an electronic transmission control device 10 according to the present disclosure. The electronic transmission control device 10 has a housing 11, a printed circuit board assembly 12, and electric or electronic modules 13, 14, which are mounted on the printed circuit board assembly 12, and form an electrical contact therewith. The printed circuit board assembly 12 has a section 15, which is positioned inside the housing 11 in a region sealed against transmission fluid. Another section 16 of the printed circuit board assembly 12 is disposed outside the housing 11 in region not sealed against the transmission fluid.

The printed circuit board assembly 12 has numerous electrically conductive conductor path layers 17a, 17b, 17c and 17d. These electrically conductive conductor path layers 17a, 17b, 17c and 17d are electrically insulated against one another through dielectric layers 18a, 18b, 18c. In the illustrated exemplary embodiment, there are four conductor path layers 17a, 17b, 17c and 17d and three dielectric layers 18a, 18b and 18c of this type.

A final, conclusive, outermost layer 20, 21 made of an oil resistant, electrically insulating, dielectric substance is applied to the outer, electrically conductive conductor path layers 17a and 17d, at least in that section 16 of the printed circuit board assembly 12 that extends outside the housing 11 in the region not sealed against transmission fluid, aside from on the electric interfaces 19, which serve to form a contact between an electric or electronic module 14 and the conductor path layers 17a and 17d.

Accordingly, no further electrically conductive layers, specifically contact layers, are applied to these conclusive, final layers 20, 21, which are largely removed subsequently through etching, but rather, the layers 20, or 21, applied to the outer conductor path layers 17a, 17d made of the oil resistant, electrically insulating substance are the conclusive, or final layers of the printed circuit board assembly 12 in the section 16 thereof extending out of the housing 11.

According to a first variation of the present disclosure, the respective conclusive, final layer 20 or 21, made of the oil resistant, electrically insulating substance is formed as a lamination layer made of a polyimide film. Then, when the conclusive, final layer 20, or 21, is made of a polyimide film, it is only partially applied to the outer conductor path layers 17a, 17d, specifically there where conductors of these conductor path layers 17a, 17d are actually running.

According to a second variation, the respective conclusive, final layer 20, 21 is designed as a lamination layer made of a prepreg. Lamination layers of this type, made of a prepreg, are less expensive than lamination layers made of a polyimide film, such that these are then applied in the region of the outer conductor path layers 17a, 17d over their entirety, excluding the electric interfaces 19.

Conclusive, final layers 20, 21 made of polyimide film, or a prepreg, respectively, are then used when the housing 11 of the electronic transmission control device 10 is made of a multi-shell aluminum die cast housing, the shells of which are pressed together.

Then, when the housing 11 of the electronic transmission control device 10 is made of a plastic, and designed as a plastic injection molded housing, the conclusive, final layers 20, 21 are preferably likewise made of a plastic. Final layers 20, 21 made of plastic are typically partially applied to the outer conductor path layers 17a, 17d, specifically there where conductors of these conductor path layers 17a, 17d actually run.

In order to produce the electronic transmission control device 10 according to the present disclosure, first a core layer 18a made of a dielectric, insulating substance is provided, which is laminated on both sides to the inner, electrically conductive conductor path layers 17b, 17c. These inner conductor path layers 17b, 17c are subjected to an etching, in order to form the desired conductor path structures thereon.

A further layer 18b or 18c, respectively, made of a dielectric, electrically insulating substance, is applied to the etched conductor path layers 17b, 17c of the core layer 18a in each case, wherein further electrically conductive conductor path layers 17a or 17d, respectively, are applied to these further, dielectric, electrically insulating layers 18b, 18c, which are subsequently subjected to an etching, in order to form the desired conductor path structures in the region of these outer conductor path layers 17a and 17d.

Although this step can be repeated multiple times, it is preferably carried out only once, i.e. only one further dielectric layer 18b and 18c, having the conductor path layers 17a, 17d treated with etching, is applied to the conductor path layers 17b, 17c accommodated on the core layer 18a, on both sides of the core layer 18a.

Following the etching of the outer conductor path layers 17a, 17d, the respective, conclusive, final layer 20 or 21, made of the oil resistant, electrically insulating substance, is applied thereto, specifically in that section 16 of the printed circuit board assembly 12 that extends outside the housing 11, in the region not sealed against oil.

As explained above, these final layers 20, 21 can be designed as lamination layers made of polyimide film or a prepreg, or alternatively, as a plastic injection molded layer.

FIG. 1 shows that inside the housing 11, in the region sealed against oil, layers 22 made of a solder resist may be applied in the corresponding section 15 of the printed circuit board assembly 12. A solder resist of this type is not resistant to transmission fluid, and therefore is not suitable for use in section 16 of the printed circuit board 12, which is exposed to transmission oil.

The interfaces 19 left exposed in section 16 of the printed circuit board assembly 12 of the respective final, conclusive, outermost layer 20, 21 are preferably provided with a coating containing nickel and gold, in order to protect them against corrosion caused by oil.

The printed circuit board assembly 12 of the electronic transmission control assembly 10 according to the present disclosure has a simple and compact construction, and can be produced with a lower expenditure than printed circuit board assemblies of known transmission control devices. Two electrically conductive layers are eliminated, such that two fewer electrically conducive layers must be laminated thereto and partially removed through etching. A printed circuit board assembly 12 for a transmission control device 10 according to the present disclosure can therefore be reduced in terms of its thickness and complexity.

REFERENCE SYMBOLS 10 transmission control device
11 housing
12 printed circuit board assembly
13 module
14 module
15 section
16 section
17a conductor path layer
17b conductor path layer
17c conductor path layer
17d conductor path layer
18a dielectric layer
18b dielectric layer
18c dielectric layer
19 interface
20 layer
21 layer
22 layer

The invention claimed is:
1. A method for forming an electronic transmission controller, the method comprising:

forming a core layer made of a material that is dielectric and electrically insulating, the core layer laminated on both sides with electrically conductive conductor path layers;

etching the electrically conductive conductor path layers applied to the core layer;

applying a second layer made of a second material that is dielectric and electrically insulating to each of the etched conductor path layers, and etching outer electrically conductive conductor path layers to the respective second layers; and applying an outer layer made of a fluid resistant, electrically insulating material to the outer electrically conductive conductor path layers in a location such that the outer layer is located partially inside a housing and partially outside the housing when the electronic transmission controller is fully assembled.

2. The method according to claim 1, wherein in the step of applying the second layer to each of the etched conductor path layers, only one second layer is applied to each of the respective etched conductor path layers of the core layer, and only one outer electrically conductive conductor path layer is applied to each of the respective second layers.

3. The method according to claim 1, wherein the housing is an aluminum die cast housing, and wherein the outer layers are designed as lamination layers made of a polyimide film or a prepreg.

4. The method according to claim 1, when wherein the housing is a plastic injection molded housing, and wherein the outer layers are formed of layers of plastic.

5. An electronic transmission controller, the electronic transmission controller comprising:

a printed circuit board assembly with a first region located inside a housing and a second region located outside the housing, the printed circuit board assembly including:

a plurality of electrically conductive conductor path layers which are electrically insulated against one another by dielectric layers, the plurality of electrically conductive conductor path layers having at least one outer electrically conductive conductor path layer and at least one inner electrically conductive conductor path layer;

an outer layer made of a fluid resistant and electrically insulating material located on the at least one outer electrically conductive conductor path layer at a location of the second region of the printed circuit board assembly, wherein the outer layer extends from the first region of the printed circuit board assembly to the second region of the printed circuit board assembly such that the outer layer is located partially inside the housing and partially outside the housing; and an exposed interface configured to serve as an electric contact between an electronic module and the printed circuit board assembly.

6. The electronic transmission controller of claim 5, further comprising the electronic module connected to the exposed interface.

7. The electronic transmission controller of claim 5, wherein the plurality of electrically conductive conductor path layers includes two electrically conductive conductor path layers.

8. The electronic transmission controller of claim 7, wherein each of the electrically conductive conductor path layers has an outer surface, and wherein the outer layer made of a fluid resistant and electrically insulating material is located on each of the outer surfaces.

9. The electronic transmission controller of claim 5, wherein the outer layer is a lamination layer made of a polyimide film.

10. The electronic transmission controller of claim 5, wherein the outer layer is a lamination layer made of a prepreg.

11. The electronic transmission controller of claim 5, further comprising the housing.

12. The electronic transmission controller of claim 11, wherein the housing includes a multi-shell aluminum die cast housing, the shells of which are pressed together.

13. The electronic transmission controller of claim 11, wherein the outer layer is an injection molded layer made of a plastic.

* * * * *